(12) United States Patent
Umezu et al.

(10) Patent No.: US 8,518,756 B2
(45) Date of Patent: *Aug. 27, 2013

(54) METHOD FOR CRYSTALLIZING THIN FILM, METHOD FOR MANUFACTURING THIN FILM SEMICONDUCTOR DEVICE, METHOD FOR MANUFACTURING ELECTRONIC APPARATUS, AND METHOD FOR MANUFACTURING DISPLAY DEVICE

(75) Inventors: Nobuhiko Umezu, Kanagawa (JP); Koichi Tsukihara, Kanagawa (JP); Goh Matsunobu, Kanagawa (JP); Yoshio Inagaki, Kanagawa (JP); Koichi Tatsuki, Kanagawa (JP); Shin Hotta, Tokyo (JP); Katsuya Shirai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/441,556

(22) Filed: Apr. 6, 2012

(65) Prior Publication Data

US 2012/0196395 A1   Aug. 2, 2012

Related U.S. Application Data

(63) Continuation of application No. 12/600,595, filed as application No. PCT/JP2008/058275 on Apr. 30, 2008, now Pat. No. 8,168,518.

(30) Foreign Application Priority Data

May 18, 2007   (JP) .................................. 2007-132785

(51) Int. Cl.
*H01L 21/00*   (2006.01)

(52) U.S. Cl.
USPC ........... 438/149; 438/129; 438/142; 438/151; 438/158; 438/166; 257/72; 257/89; 257/98; 257/204; 257/E21.413

(58) Field of Classification Search
None
See application file for complete search history.

(56) References Cited

U.S. PATENT DOCUMENTS 8,168,518 B2 * 5/2012 Umezu et al. ................. 438/496
2001/0055830 A1 12/2001 Yoshimoto

FOREIGN PATENT DOCUMENTS

| JP | 62-199012 | 9/1987 |
| JP | 2002-083820 | 3/2002 |
| JP | 2004-128261 | 4/2004 |
| JP | 2004-134577 | 4/2004 |

* cited by examiner

Primary Examiner — Kyoung Lee
(74) Attorney, Agent, or Firm — Dentons US LLP

(57) ABSTRACT

A method for crystallizing a thin film A gate insulating film formed on a substrate so as to cover a gate electrode. A light absorption layer is formed thereon through a buffer layer. Energy lines Lh are applied to the light absorption layer from a continuous-wave laser such as a semiconductor laser. This anneals only a surface side of the light absorption layer Lh and produces a crystalline silicon film obtained by crystallizing the amorphous silicon film using heat generated by thermal conversion of the energy lines Lh at the light absorption layer and heat of the annealing reaction.

13 Claims, 10 Drawing Sheets

(A)

(B)

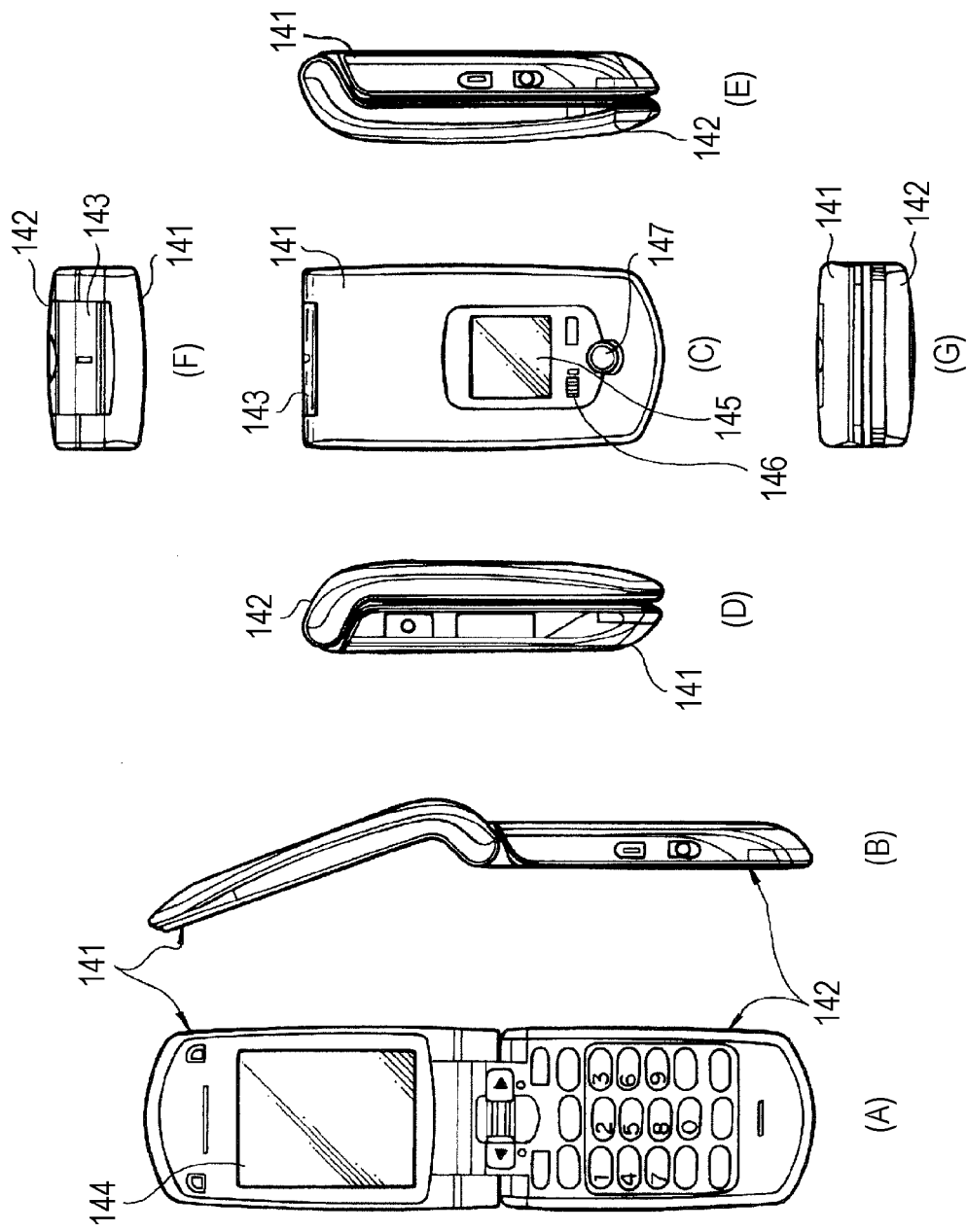

METHOD FOR CRYSTALLIZING THIN FILM, METHOD FOR MANUFACTURING THIN FILM SEMICONDUCTOR DEVICE, METHOD FOR MANUFACTURING ELECTRONIC APPARATUS, AND METHOD FOR MANUFACTURING DISPLAY DEVICE

RELATED APPLICATION DATA

This application is a continuation of U.S. patent application Ser. No. 12/600,595, filed Nov. 17, 2009, the entirety of which is incorporated herein by reference to the extent permitted by law, which is the Section 371 National Stage of PCT/JP2008/058275. This application 371 National Stage of PCT International Application No. PCT/JP2008/058275, filed Apr. 30, 2008 and Japanese Patent Application No. JP 2007-132785, filed May 18, 2007.

TECHNICAL FIELD

The present invention relates to a method for crystallizing a thin film that is suitable for the crystallization of a semiconductor thin film; and a method for manufacturing a thin film semiconductor device, a method for manufacturing an electronic apparatus, and a method for manufacturing a display device that use the crystallization method.

BACKGROUND ART

Semiconductor thin films are widely used for thin film transistors (TFTs) and solar cells. In particular, polycrystalline silicon TFTs that use polycrystalline silicon (polySi) have higher carrier mobility than amorphous silicon TFTs that use amorphous silicon. Therefore, the polycrystalline silicon TFTs are widely used as a liquid crystal display device, a liquid crystal projector, a switching element for organic EL display devices that use organic electroluminescence elements, or a circuit element of driving drivers of these display devices.

A so-called low-temperature polysilicon process that uses only a low-temperature process performed at about 600° C. or less has been developed as a manufacturing technology of such a polycrystalline silicon TFT, which reduces the costs of a substrate. In the low-temperature process, pulsed laser crystallization technology in which a silicon film is crystallized using a pulsed laser whose oscillation time is extremely short is widely used. Pulsed laser crystallization is a technology that uses a property in which a silicon thin film on a substrate instantly melted by applying high-power pulsed laser beams thereto crystallizes during its solidification.

Furthermore, a method for crystallizing a lower-layer semiconductor thin film by applying laser beams from the upper side of a light absorption layer has been proposed in recent years. In this case, for example, an amorphous silicon film is formed, and a first insulating film composed of silicon oxide or silicon nitride is formed thereon. Subsequently, a light absorption layer composed of a metallic material is formed, and a second insulating film composed of silicon oxide or silicon nitride is further formed. After that, laser beams are applied to the laminate while being relatively moved. As a result, the temperature is rapidly increased at the area on the light absorption layer where the laser beams are applied, and a high-temperature region is formed in the amorphous silicon film due to thermal conduction. The amorphous silicon film is melted and crystal growth occurs. Thus, a polycrystalline silicon layer whose crystal grows from a liquid phase is formed in the area where the laser beams have been scanned. Note that the second insulating film is formed for inhibiting oxidation of the light absorption layer caused by temperature increase. Therefore, when the laser beams are applied in an inert gas atmosphere, the second insulating film is not required (up to this point, refer to, for instance, Japanese Unexamined Patent Application Publication No. 2004-134577 Paragraphs 0035 to 0048).

DISCLOSURE OF INVENTION

However, the crystallization method that uses a light absorption layer described above has the following problem. In other words, to inhibit the oxidation of the light absorption layer caused by temperature increase during the application of the laser beams, the second insulating film for inhibiting oxidation is disposed on the light absorption layer or the laser beams are applied in an inert gas atmosphere in this crystallization method.

However, when the laser beams are applied while the second insulating film for inhibiting oxidation is disposed on the light absorption layer, the second insulating film composed of silicon oxide or silicon nitride is solidified due to the heat generated by the application of the laser beams. Therefore, an extensive process for removing the second insulating film is required. On the other hand, when the laser beams are applied in an inert gas atmosphere, a processing chamber for crystallization needs to be prepared, which requires large-scale equipment.

Accordingly, an object of the present invention is to provide a method for crystallizing a thin film with good controllability at low costs achieved with simpler process; and a method for manufacturing a thin film semiconductor device, a method for manufacturing an electronic apparatus, and a method for manufacturing a display device that achieve good device characteristics and low costs by applying the crystallization method.

The crystallization method of the present invention for achieving the object described above is characterized by conducting the following procedure. First, a thin film is formed on a substrate and a light absorption layer is then formed on the thin film. Subsequently, energy lines are applied to the light absorption layer. Herein, only a surface side of the light absorption layer is oxidized while the thin film is crystallized using heat generated by thermal conversion of the energy lines at the light absorption layer and heat of the oxidation reaction.

In such a crystallization method, only the surface side of the light absorption layer is oxidized by applying energy lines used when the thin film is crystallized. As a result, uncontrollable generation of heat caused by explosive oxidation occurring when the entire light absorption layer is oxidized is prevented and the thin film is crystallized by well-controlled generation of heat of the light absorption layer without disposing an insulating film for inhibiting oxidation on the light absorption layer and without applying energy lines in an inert gas atmosphere. Moreover, since the oxidation reaction occurs at a certain temperature or higher, the temperature becomes a threshold value. Thus, temperature-controlled crystallization is performed with good reproducibility even if the power density of the application of energy lines is set to be a value that is about two-orders of magnitude higher than that of the related art, which can provide efficient crystallization.

In addition, the present invention provides a method for manufacturing a thin film semiconductor device, a method for manufacturing an electronic apparatus, and a method for manufacturing a display device that use the crystallization method described above.

According to the present invention, as described above, a thin film can be efficiently crystallized with good controllability without disposing an insulating film for inhibiting oxidation on a light absorption layer and without applying energy lines in an inert gas atmosphere. This can simplify the manufacturing steps of a thin film semiconductor device that uses a semiconductor thin film as a thin film, an electronic apparatus, and a display device; reduce the costs; and improve the characteristics.

BRIEF DESCRIPTION OF DRAWINGS

FIG. 15 is a diagram showing a portable terminal device such as a cellular phone to which the present invention is applied, in which (A) is a front view when the phone is open, (B) is a side view thereof, (C) is a front view when the phone is closed, (D) is a left side view, (E) is a right side view, (F) is a top view, and (G) is a bottom view.

BEST MODES FOR CARRYING OUT THE INVENTION

An embodiment of the present invention will now be described in detail with reference to the drawings. Herein, a method for manufacturing a thin film transistor substrate is described as a method for crystallizing a thin film, a method for manufacturing a thin film semiconductor device, and a method for manufacturing an electronic apparatus. Subsequently, a display device that uses the thin film transistor substrate is described.

<Method for Manufacturing Thin Film Transistor Substrate>

Figure 1:
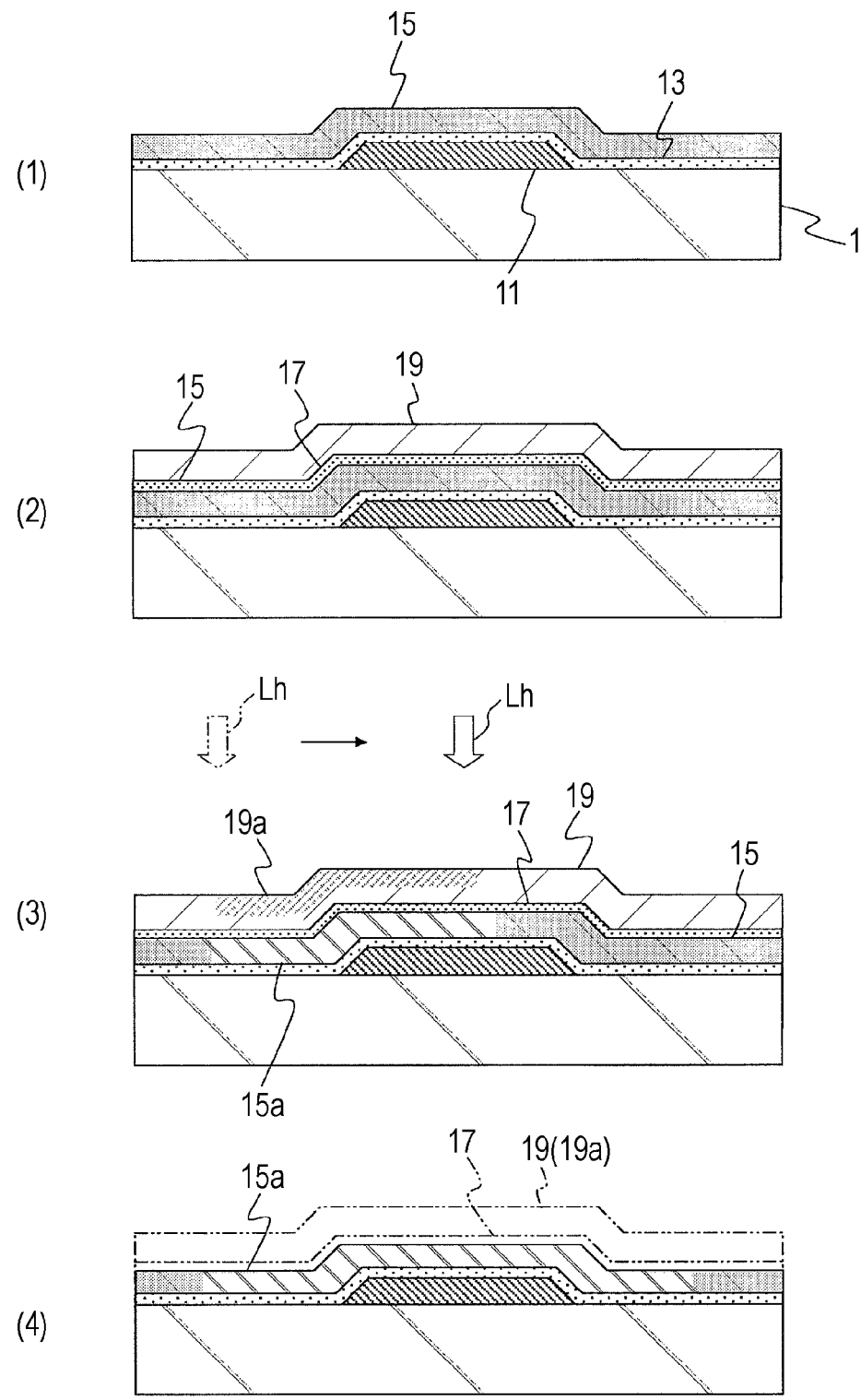
FIG. 1 is a process sectional view (part 1) showing a manufacturing method of an embodiment.
Figure 2:
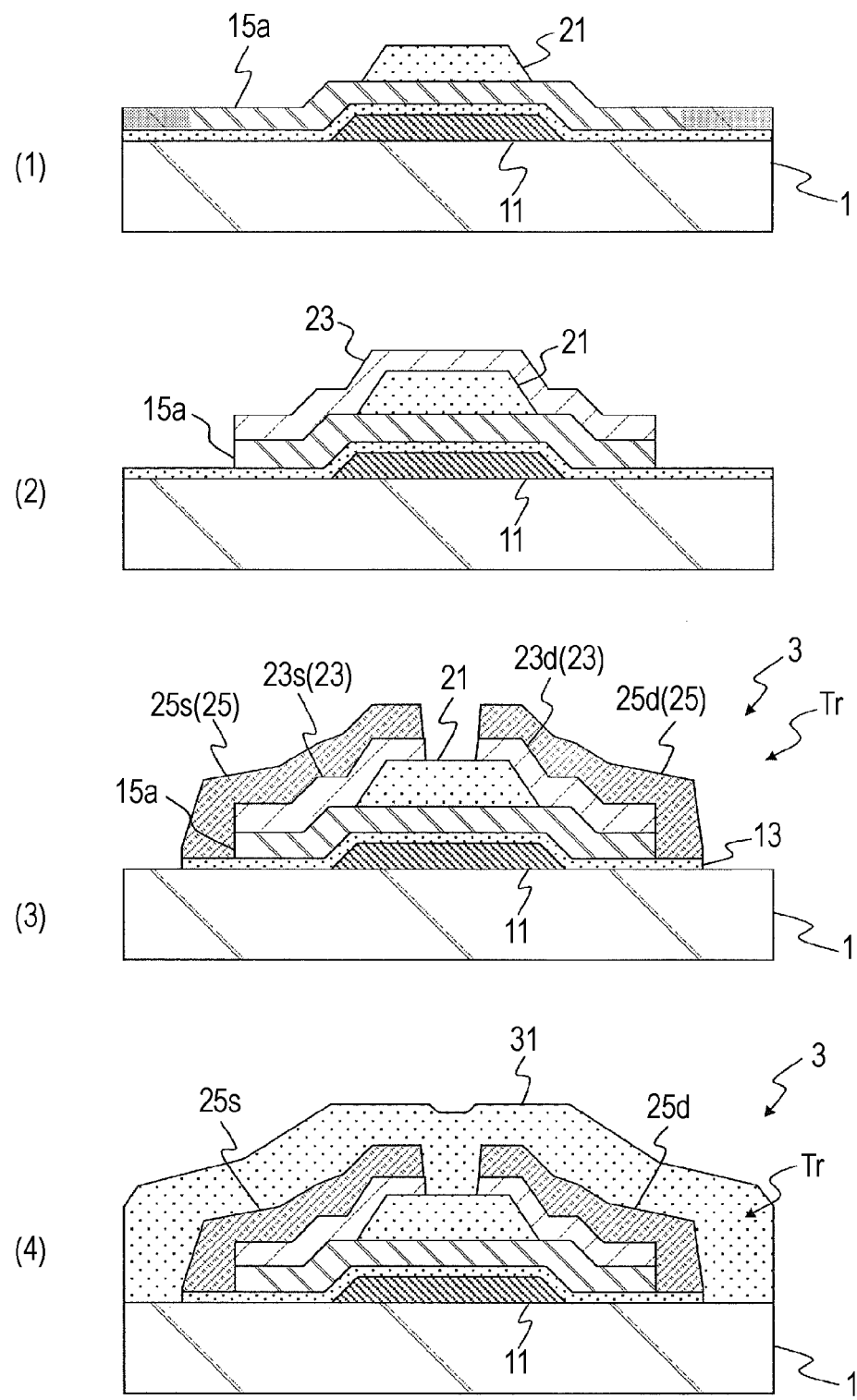
FIG. 2 is a process sectional view (part 2) showing the manufacturing method of the embodiment.

FIGS. 1 and 2 are process sectional views in the case where a method for manufacturing a semiconductor device of the present invention is applied to manufacturing of a thin film transistor substrate.

First, an insulating substrate 1 is prepared as shown in FIG. 1(1). A glass substrate or a plastic substrate is used as the substrate 1. Since any substrate whose surface is insulated can be used, for example, a substrate obtained by disposing an insulating layer on a surface of a semiconductor substrate may be used.

Next, a gate electrode 11 is patterned on the substrate 1. The gate electrode 11 is formed of a conductive material such as molybdenum (Mo).

Subsequently, a gate insulating film 13 constituted by a single layer or multiple layers of, for example, a silicon nitride film, a silicon oxide film, and a metallic oxide film is formed by sputtering, CVD, or the like so as to cover the gate electrode 11. In this case, the bottom layer of the gate insulating film 13 is preferably a layer that functions as a barrier layer for preventing a contaminant from diffusing to upper layers from the substrate 1 side. For example, a silicon nitride film is preferred.

Furthermore, in the case where a metallic oxide film is used to increase the dielectric constant of the gate insulating film 13, for example, titanium oxide (TiOx) or another high dielectric constant metallic oxide is disposed on the barrier layer. Such a metallic oxide film is formed in an amorphous state by, for example, MOCVD (metal-organic chemical vapor deposition) that uses a metal organic gas.

After that, an amorphous silicon film 15 is deposited as a semiconductor thin film on the gate insulating film 13 by CVD, sputtering, or the like. The amorphous silicon film 15 is formed with a thickness of, for instance, 10 to 50 nm. In addition, the thickness of the amorphous silicon film 15 formed herein is preferably 20 nm or less in the case where amorphous silicon is crystallized to form a relatively uniform microcrystal by irradiation with energy lines performed later.

Next, as shown in FIG. 1(2), a light absorption layer 19 is formed on the amorphous silicon film 15 through a buffer layer 17.

Herein, the buffer layer 17 is a layer for preventing a metallic material mainly constituting the light absorption layer 19 from diffusing to the amorphous silicon film 15 side and for preventing a thermal reaction between the metallic material and silicon. Such a buffer layer 17 is formed of, for example, silicon oxide with a thickness of, for instance, 5 to 50 nm.

Furthermore, the light absorption layer 19 needs only to be composed of a material that absorbs energy lines and converts them into heat in the irradiation with energy lines performed next. Such a light absorption layer 19 is composed of a metallic material such as chromium (Cr), molybdenum (Mo), tantalum (Ta), titanium (Ti), tungsten (W), or cobalt (Co) or a silicide such as WSi, MoSi, TiSi, TaSi, or CoSi. In this case, a light absorption layer 19 composed of, for example, molybdenum (Mo) is formed. Such a light absorption layer 19 is formed with a thickness of, for instance, 50 to 300 nm.

Next, energy lines Lh are applied to the light absorption layer 19 as shown in FIG. 1(3). Herein, energy lines Lh with a wavelength that is absorbed into the light absorption layer 19 are applied to the light absorption layer 19 in an atmosphere containing oxygen. Subsequently, the light absorption layer 19 exposed in the atmosphere containing oxygen absorbs the energy lines Lh to generate heat. Consequently, only the surface side of the light absorption layer 19 is oxidized to form an oxidation layer 19a. Herein, in other words, the oxidation layer 19a is formed so as to leave a layer that is not oxidized on the lower surface side of the light absorption layer 19. Thus, the amorphous silicon film 15 is crystallized by generating heat through the absorption of the energy lines Lh into the light absorption layer 19. At the same time, the crystallization annealing treatment of the amorphous silicon film 15 is performed using the heat of the oxidation reaction.

Through the annealing treatment, the amorphous silicon film 15 is crystallized to form a microcrystalline silicon film 15a. Note that the amorphous silicon film 15 may be crystallized to form a polycrystalline silicon film herein. However, the amorphous silicon film 15 is microcrystallized in a non-melting mode herein.

Accordingly, characteristic variation between devices can be suppressed compared with a thin film transistor that uses, for example, polycrystalline silicon in a channel region. In this case, by adjusting the thickness of the amorphous silicon film 15 to 20 nm or less as described above, the particle size does not increase and microcrystallization is completed with a more stable particle size. Therefore, the characteristic variation can be further suppressed. Moreover, the temperature in the microcrystallization performed in a non-melting mode does not reach a temperature at which amorphous silicon is melted. Thus, even if a glass substrate or a plastic substrate having low thermal resistance is used, the damage to the substrate 1 can be prevented.

Figure 3:
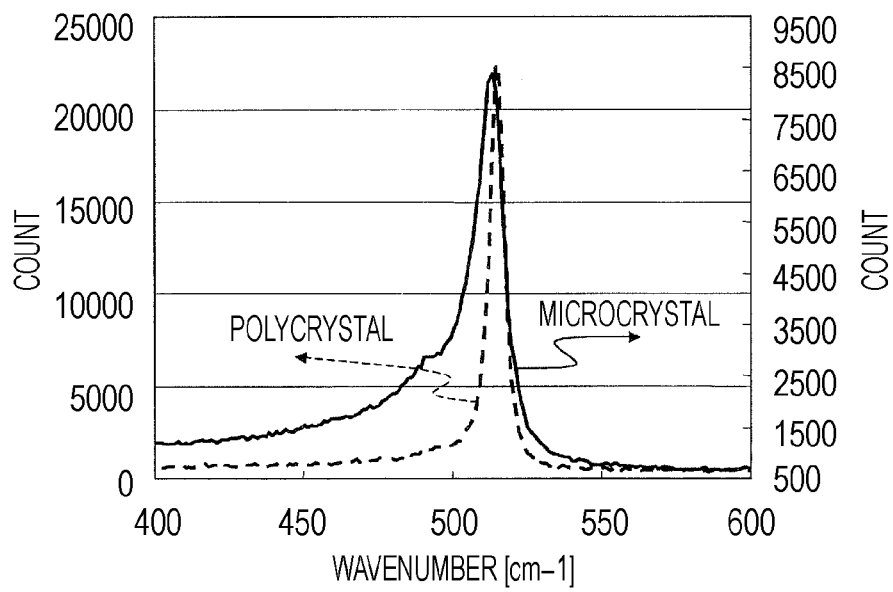
FIG. 3 is a Raman spectrum of microcrystalline silicon and polycrystalline silicon.

Such a crystalline state is confirmed using a Raman spectrum. As shown in FIG. 3, the peak shapes of Raman spectra are different between microcrystalline silicon and polycrystalline silicon. In the microcrystalline silicon, a distinctive broad peak appears at a wavenumber of 480 to 520 [cm$^{-1}$]. On the other hand, in the polycrystalline silicon, such a peak does not appear at a wavenumber of 480 to 520 [cm$^{-1}$]. Thus, a device with significantly low variation in electrical properties can be made.

The crystallization annealing treatment described above may be performed, for instance, in the air as long as the atmosphere contains oxygen.

Furthermore, the crystallization annealing treatment described above that oxidizes only the surface side of the light absorption layer 19 is performed by controlling the irradiation energy of the energy lines Lh. For example, the crystallization annealing treatment is performed under the conditions that the power density of the energy lines Lh on the light absorption layer 19 is 100 kW/cm$^2$ or more and irradiation time at any point in the irradiation region is 1 msec or less (preferably 100 μsec). Thus, by performing the treatment at a power density that is about two-orders of magnitude higher than that of the related art and at a short time of 100 μsec, only the surface side of the light absorption layer 19 can be oxidized with high controllability without causing uncontrollable explosive oxidation.

For the irradiation of such energy-controlled energy lines, a laser source that is easily controlled is preferably used and continuous-wave laser or pseudo continuous-wave laser is used. Specifically, semiconductor laser having an oscillation wavelength of 200 nm to 2000 nm is preferably used.

Furthermore, in the irradiation with the energy lines Lh described above, only a desired portion is scan-irradiated with the energy lines Lh with the irradiation position relative to the light absorption layer 19 being moved. Herein, a region above the gate electrode 11 and its periphery may be partly scan-irradiated with the energy lines Lh. Accordingly, the throughput of the crystallization annealing treatment is improved while distortion of the substrate 1 is prevented by shortening the time of thermal diffusion.

Note that, when a metallic oxide film is used as the gate insulating film 13, the heat generated at the light absorption layer 19 diffuses to not only the amorphous silicon film 15 but also the metallic oxide film that is a lower layer. Therefore, the metallic oxide film can be also crystallized at the same time to form a crystalline metallic oxide film.

In addition, by applying energy lines such that thermal diffusion reaches the gate electrode 11, the crystallinity of the amorphous silicon film 15 portion above the gate electrode 11 and its periphery can be increased compared with that of other portions. Furthermore, in this crystallization annealing treatment, the effect of crystallization annealing obtained through the irradiation with energy lines from the side of the substrate 1 composed of a transparent material may be combined by using the gate electrode 11 as a light absorption layer.

Next, the principle of the above-mentioned crystallization annealing treatment is described.

Figure 4:
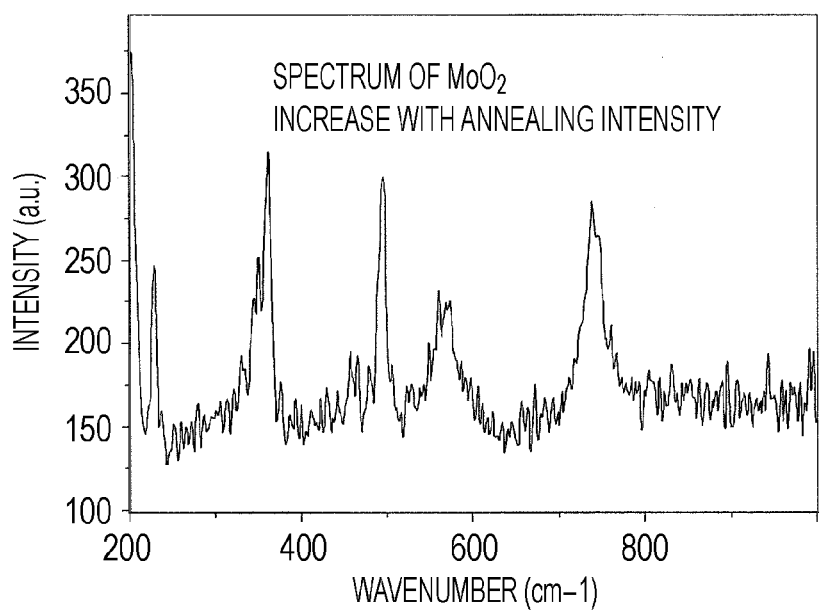
FIG. 4 is a Raman spectrum of a surface ($MoO_2$) on which molybdenum (Mo) is oxidized by applying energy lines Lh.

When the light absorption layer 19 is irradiated with the energy lines Lh, oxidation is advanced from the surface side of the light absorption layer 19 due to the generation of heat caused by the absorption of the energy lines Lh at the light absorption layer 19. For example, in the case where the light absorption layer 19 is formed of molybdenum (Mo), the oxidation reaction of molybdenum (Mo) occurs at about 500° C. FIG. 4 shows a Raman spectrum of the surface (MoO$_2$) on which molybdenum (Mo) is oxidized due to the generation of heat caused by irradiation with the energy lines Lh. Oxidation amount increases as the irradiation amount of the energy lines Lh increases. Consequently, the peaks of the Raman spectrum also become higher. However, when the thickness of the light absorption layer 19 that is left without being oxidized falls below a certain thickness after the oxidation is further advanced, explosive oxidation in which out-of-control oxidation is rapidly advanced is caused.

In the oxidation of the light absorption layer 19 described above, the irradiation amount of the energy lines Lh and the oxidation amount exhibit substantially a linear behavior before such explosive oxidation is caused.

Therefore, as with the crystallization annealing treatment of the embodiment described above, crystallization annealing treatment can be performed with good controllability while thermal diffusion and thermal equilibrium, at the light absorption layer 19, of the heat generated by light absorption and oxidation reaction at the light absorption layer 19 are maintained by controlling the irradiation amount of the energy lines Lh such that only the surface side of the light absorption layer 19 is oxidized. Thus, microcrystals with good reproducibility can be obtained.

Note that explosive oxidation breaks down the thermal equilibrium balance between thermal influx and thermal diffusion. This damages all of the layers in the thickness direction of the light absorption layer 19 due to oxidation before the temperature reaches a temperature at which an amorphous silicon layer is microcrystallized. As a result, crystallization annealing treatment with good controllability cannot be performed.

Herein, the crystallization annealing treatment described above is controlled as follows.

That is to say, by irradiating the light absorption layer 19 having the laminate components described above with the energy lines Lh, the light absorption layer 15 is oxidized while the amorphous silicon film 15 is crystallized (microcrystallized). Consequently, transmitted light intensity T of the laminate structure is changed. Thus, for example, assuming that the transmitted light intensity at a portion where the energy lines Lh are not applied is T0 and the transmitted light intensity at a portion where the energy lines Lh are applied is T1, transmission contrast is defined as (T1−T0)/(T1+T0).

Figure 5:
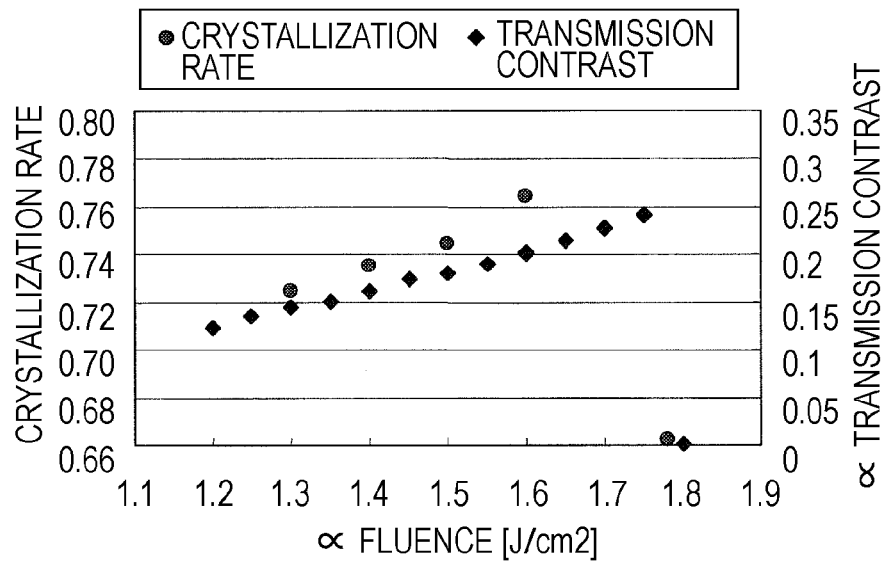
FIG. 5 is a graph showing crystallization rate of silicon and transmission contrast of a laminate plotted as a function of irradiation amount (fluence) of the energy lines Lh.

Now, as shown in FIG. 5, it is clear that the crystallization rate and transmission contrast are proportional to the irradiation amount (fluence) of the energy lines Lh. As is also evident from FIG. 5, when the irradiation amount of the energy lines Lh is increased and the transmission contrast exceeds a certain value, the crystallization annealing cannot be controlled due to the explosive oxidation described above and the values of transmission contrast and crystallization rate cannot be measured. This makes it clear that it is important to perform crystallization annealing treatment to the extent to which the crystallization rate can be measured (the extent to which explosive oxidation is not caused).

Figure 6:
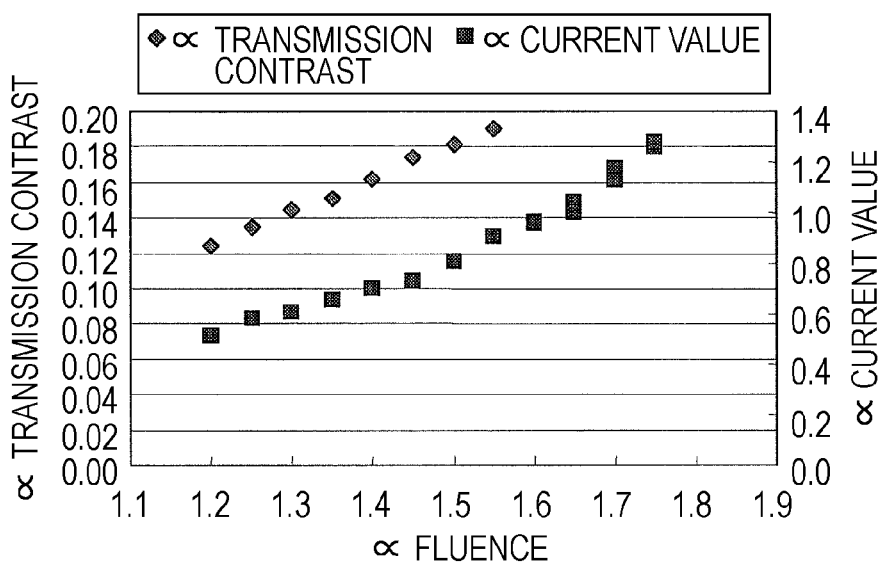
FIG. 6 is a graph showing transmission contrast of a laminate and current value of a thin film transistor (TFT) in which a microcrystalline silicon film crystallized by applying the energy lines Lh is used in a channel region, plotted as a function of irradiation amount (fluence) of the energy lines Lh.

Furthermore, in FIG. 6, a current value of a thin film transistor (TFT) in which the microcrystalline silicon film subjected to the crystallization annealing treatment is used in a channel region and transmission contrast are plotted as a function of the irradiation amount (fluence) of the energy lines Lh. As is evident from FIG. 6, the current value of the TFT increases as the irradiation amount of the energy lines Lh increases. This makes it clear that it is advantageous for device formation to adjust the transmission contrast to a higher value to the extent to which explosive oxidation is not caused.

Figure 7:
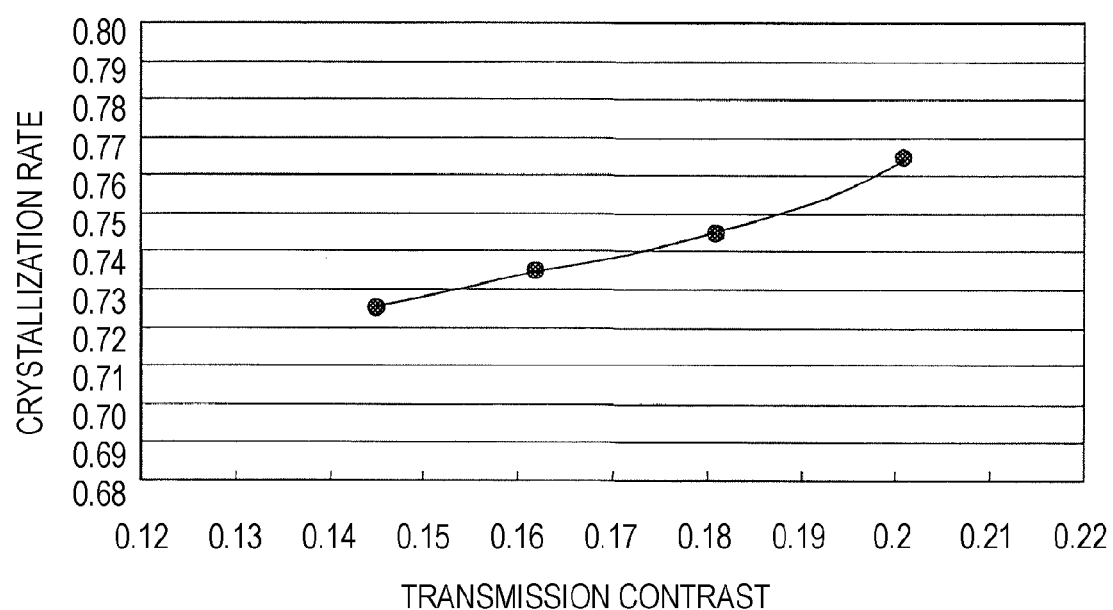
FIG. 7 is a graph showing the relationship between crystallization rate of silicon and transmission contrast.

Thus, as shown in FIG. 7, a corresponding curved line between the crystallization rate and transmission contrast of the amorphous silicon film 15 is prepared in advance for each of the laminate components disposed below the light absorption layer 19 to be irradiated with the energy lines Lh. The crystallization annealing treatment is then performed such that a desired transmittance is achieved (that is, a desired crystallization rate and the extent to which explosive oxidation is not caused) by controlling the irradiation amount (power and irradiation time) of the energy lines Lh while monitoring the value of the transmission contrast in real time and giving the feedback. As a result, crystallization annealing in which the crystallization rate and device characteristics (current value) are controlled with high precision can be performed on the basis of the value of transmission contrast that can be measured more easily.

From the above description, as shown in FIG. 1(4), the amorphous silicon film (15) is microcrystallized at a desired portion to form a microcrystalline silicon film 15a. After that, the light absorption layer 19 and the buffer layer 17 are removed by etching. In addition, in the case where a silicon insulating film such as SiNx, SiOx, or SiON is used as the buffer layer 17, the buffer layer 17 is not removed and may be directly used as an etching stop layer described below or part of the etching stop layer.

After that, the same steps as the manufacturing steps of a typical amorphous silicon thin film transistor may be conducted. Therefore, this decreases the costs compared with polycrystal process.

In other words, first, an etching stop layer 21 is patterned on the microcrystalline silicon film 15a so as to overlap the gate electrode 11 as shown in FIG. 2(1). The etching stop layer 21 composed of a silicon insulating film such as SiNx, SiOx, or SiON is formed by patterning the insulating film through etching, using a resist pattern formed by backside exposure as a mask. Such an etching stop layer 21 is formed with a thickness of, for example, about 50 to 500 nm.

Next, an $n^+$ amorphous silicon film 23 is formed above the substrate 1 by CVD or the like so as to cover the etching stop layer 21 as shown in FIG. 2(2). The $n^+$ amorphous silicon film 23 is formed with a thickness of, for example, 10 to 300 nm. Subsequently, the $n^+$ amorphous silicon film 23 and the microcrystalline silicon film 15a disposed therebelow are patterned in a shape of an active region that covers the gate electrode 11 and extends on both sides of the gate electrode 11, by etching using a resist pattern (not shown) as a mask. After the etching, the resist pattern is removed. Note that a portion of the microcrystalline silicon film 15a that corresponds to a portion where the gate electrode 11 is laminated is a channel region.

Subsequently, a metal layer 25 composed of aluminum (Al) or titanium (Ti) or a laminate thereof is formed by sputtering or the like as shown in FIG. 2(3). Next, the metal layer 25 and the $n^+$ amorphous silicon film 23 are patterned so as to be separated above the gate electrode 11 and the metal layer 25 is formed in a wiring pattern by, for instance, etching using a resist pattern (not shown) as a mask. Thus, a source electrode 25s and a drain electrode 25d constituted by the metal layer 25 are formed, and a source 23s and a drain 23d constituted by the $n^+$ amorphous silicon film 23 are also formed. Alternatively, in this etching, the crystalline gate insulating film 13 that is a lower layer may be patterned while the etching stop layer 21 stops the etching.

A bottom-gate thin film transistor Tr whose channel region is constituted by the microcrystalline silicon film 15a is obtained through the steps described above.

After that, a passivation film 31 composed of, for example, silicon nitride is formed on the entire substrate 1 by CVD or the like so as to cover the source electrode 25s and the drain electrode 25d as shown in FIG. 2(4). As a result, a TFT substrate 3 made by disposing the bottom-gate thin film transistor Tr on the substrate 1 is obtained.

<Display Device>

Figure 8:
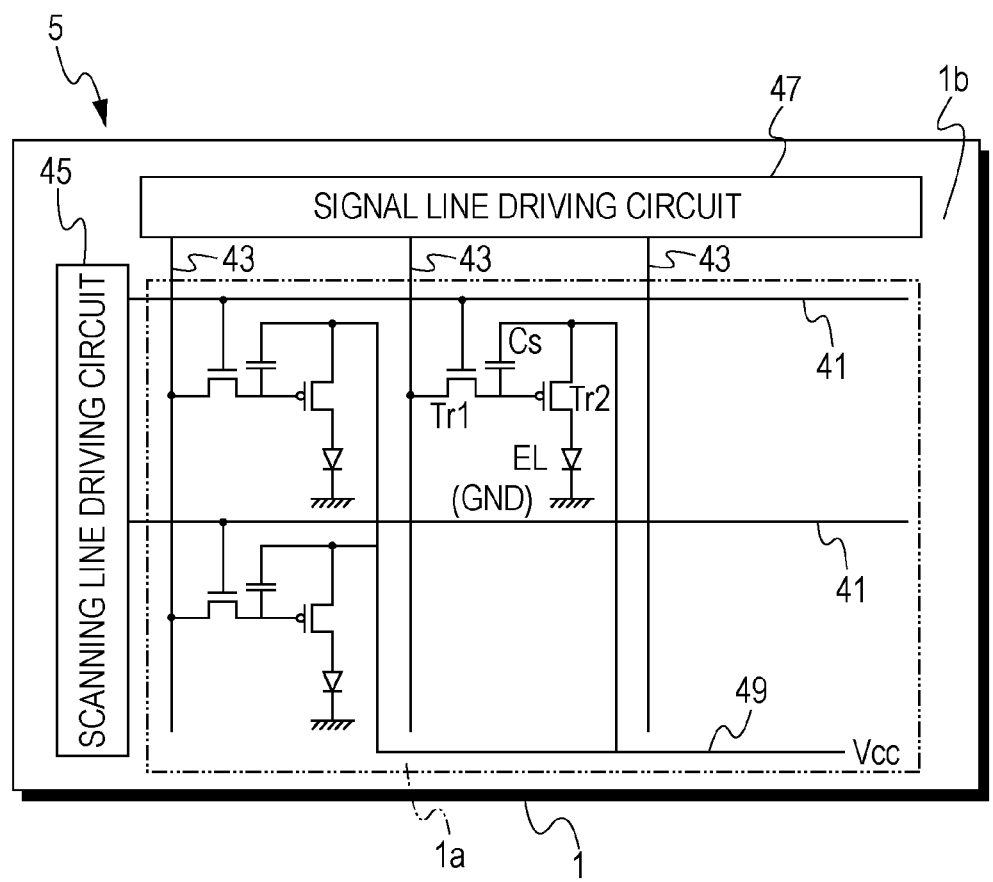
FIG. 8 is a diagram showing one example of a panel structure of a display device.

FIG. 8 is a schematic diagram of a panel structure for describing one structural example of an organic EL display device, which is shown as an example of a display device 5 that uses the thin film transistor substrate manufactured as described above.

As shown in the drawing, a display region 1a and its peripheral region 1b are provided on the substrate 1 constituting the display device 5. In the display region 1a, a plurality of scanning lines 41 and a plurality of signal lines 43 are arranged horizontally and vertically, and there are pixel array portions in which one pixel is disposed at each of the intersections. Furthermore, a scanning line driving circuit 45 that drives the scanning lines 43 and a signal line driving circuit 47 that supplies video signals according to brightness information (that is, input signals) to the signal lines 43 are disposed in the peripheral region 1b.

A pixel circuit disposed at each of the intersections between the scanning lines 41 and signal lines 43 includes, for example, a switching thin film transistor Tr1, a driving thin film transistor Tr2, a storage capacitor Cs, and an organic electroluminescence element EL. Then, when scanning pulses are applied to the scanning lines 41 through driving of the scanning line driving circuit 45 and certain signals are supplied to the signal lines 43, the switching thin film transistor Tr1 is turned ON. As a result, video signals written from the signal lines 43 are stored in the storage capacitor Cs. Electric current based on the amount of the stored signals is supplied to the organic electroluminescence element EL through the driving thin film transistor Tr2. The organic electroluminescence element EL emits light at a brightness based on the electric current value. Note that the driving thin film transistor Tr2 and the storage capacitor Cs are connected to a common power supply line (Vcc) 49.

In such a structure, the switching thin film transistor Tr1 and the driving thin film transistor Tr2 are manufactured in the process described above, and the storage capacitor Cs is also manufactured through the same steps.

Herein, the structure of the pixel circuit described above is merely an example. A capacitor element may be optionally disposed in the pixel circuit and a plurality of transistors may be disposed to constitute the pixel circuit. Moreover, a driving circuit required in accordance with the modification of the pixel circuit may be further added to the peripheral region 1*b*.

Figure 9:
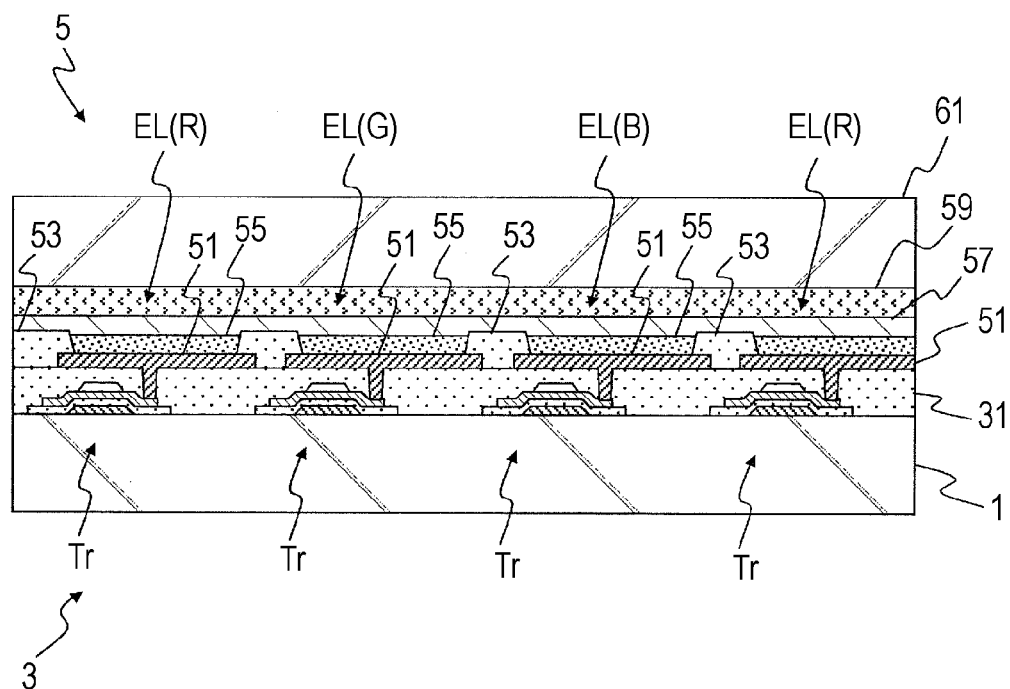
FIG. 9 is diagram showing one example of a panel structure of a display device to which the present invention is applied.

FIG. 9 is a schematic sectional view of a principal part of the display device 5 showing four pixels. As shown in the drawing, a TFT substrate 3 is used as a driving substrate in which a thin film transistor Tr (corresponding to the driving thin film transistor Tr2), the switching thin film transistor Tr1 (not shown), and the storage capacitor Cs (not shown) are arranged in each of the pixels. An organic electroluminescence element EL is disposed thereon through a planarization insulating film that also functions as a passivation film 31. For the organic electroluminescence element EL, a red light emitting element EL (R) that emits red light, a green light emitting element EL (G) that emits green light, and a blue light emitting element EL (B) that emits blue light are disposed in sequence in a matrix as a whole.

The organic electroluminescence element EL includes a pixel electrode 51 connected to the thin film transistor Tr through a connection hole formed in the planarization insulating film 31. The pixel electrode 51 is insulated from the next pixel electrode 51 through an insulating film pattern 53 that covers its periphery. Furthermore, an organic layer 55 containing a light-emitting layer and a common electrode 57 that is common to each of the pixels are laminated on the pixel electrode 51, and the portion where the organic layer 55 is sandwiched between the two electrodes 51 and 57 functions as the organic electroluminescence element EL.

Herein, the pixel electrode 51 is used as an anode and also has a function as a reflective layer. In contrast, the common electrode 57 is used as a cathode and also as a translucent electrode that has translucency to light generated in the organic layer 55. In addition, in order to emit emission light from the common electrode 57 side by causing the emission light generated in the organic layer to resonate, the thickness of the organic layer 55 sandwiched between the electrodes 51 and 57 is adjusted so as to be suitable for emission colors of the organic electroluminescence element EL. The organic layer 55 is constituted by laminating, for example, a hole transport layer, a light-emitting layer, and an electron transport layer in sequence from the side of the pixel electrode 51 that is an anode, and emission light is effectively generated in the light-emitting layer through the recombination of electrons and holes.

A sealing substrate 61 is bonded to the TFT substrate 3 on which the organic electroluminescence element EL described above is formed, through an adhesive 59 so as to sandwich the organic electroluminescence element EL. The adhesive 59 and the sealing substrate 61 are composed of a material that allows the emission light from the organic electroluminescence element EL to pass through.

Furthermore, although not shown herein, color filters such as a red filter, a green filter, and a blue filter may be disposed on the sealing substrate 61 composed of a material such as transparent glass so as to correspond to respective pixel portions (the portions where the organic electroluminescence element EL is disposed). Moreover, a black matrix is disposed between the pixels and at the periphery of the display region where the pixels are arranged, which takes out emission light from the organic electroluminescence element EL and absorbs outside light reflected at the organic electroluminescence element EL or the like to improve the contrast.

Although the color filters and the black matrix may be disposed on either surface of the sealing substrate 61, they are desirably disposed on the TFT substrate 3 side. This can protect the color filters and the black matrix without exposing them on a surface.

Figure 10:
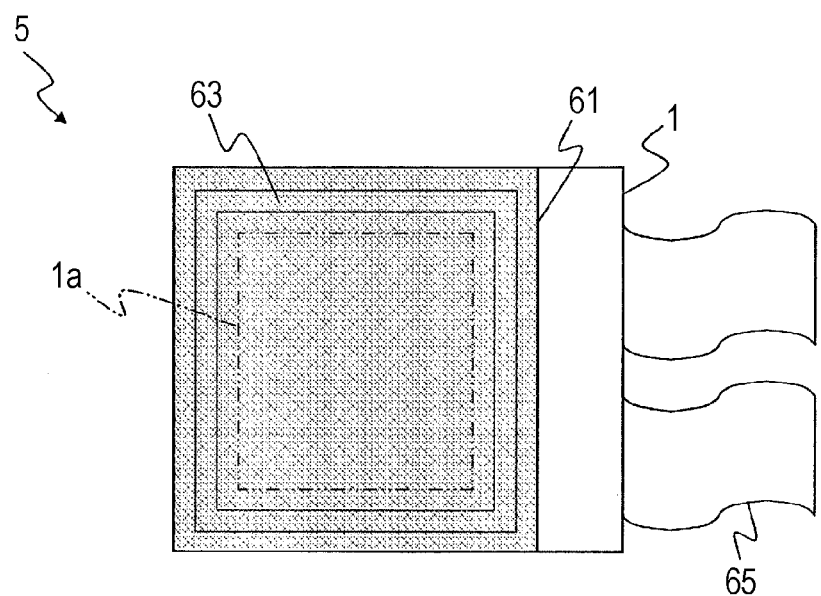
FIG. 10 is a structural view showing a display device having a sealed module shape to which the present invention is applied.

In addition, the display device 5 according to the present invention includes a device having a sealed module shape disclosed in FIG. 10. An example of the device includes a display module that has a sealing portion 63 formed so as to surround the display region 1*a* which is a pixel array portion and that is formed by being bonded to a counter portion (the sealing substrate 61) composed of, for example, transparent glass using the sealing portion 63 as an adhesive. As described above, the color filters, a protection film, the black matrix, and the like may be disposed on the transparent sealing substrate 61. Note that a flexible printed circuit board 65 for inputting and outputting signals or the like to the display region 1*a* (pixel array portion) from the outside may be disposed on the substrate 1 that is used as the display module in which the display region 1*a* is formed.

Application Examples

The display device according to the present invention described above can be applied to a display device of an electronic apparatus in any field that displays, as an image or video, the video signals inputted to or generated in various electronic apparatuses shown in FIGS. 11 to 15 including digital cameras, notebook personal computers, portable terminal devices such as cellular phones, and camcorders. An example of an electronic apparatus to which the present invention is applied is hereinafter described.

Figure 11:
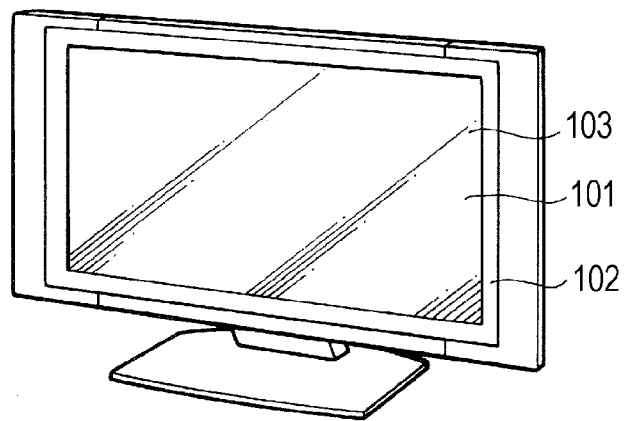
FIG. 11 is a perspective view showing a television to which the present invention is applied.

FIG. 11 is a perspective view showing a television to which the present invention is applied. The television according to this application example includes a video display screen 101 constituted by a front panel 102, a filter glass 103, and the like, and is manufactured by using the display device according to the present invention as the video display screen 101.

Figure 12:
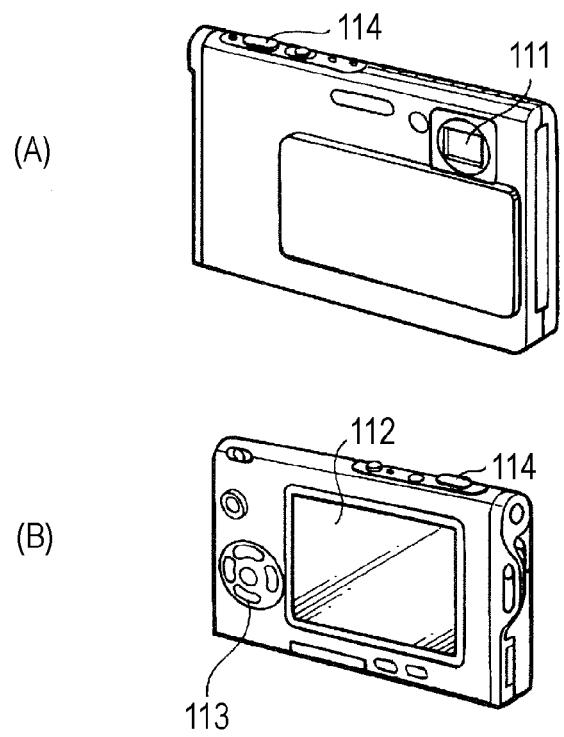
FIG. 12 is a diagram showing a digital camera to which the present invention is applied, in which (A) is a perspective view seen from the front side and (B) is a perspective view seen from the back side.

FIG. 12 is a diagram showing a digital camera to which the present invention is applied, in which (A) is a perspective view seen from the front side and (B) is a perspective view seen from the back side. The digital camera according to this application example includes a light-emitting section 111 for flash, a display section 112, a menu switch 113, a shutter button 114, and the like, and is manufactured by using the display device according to the present invention as the display section 112.

Figure 13:
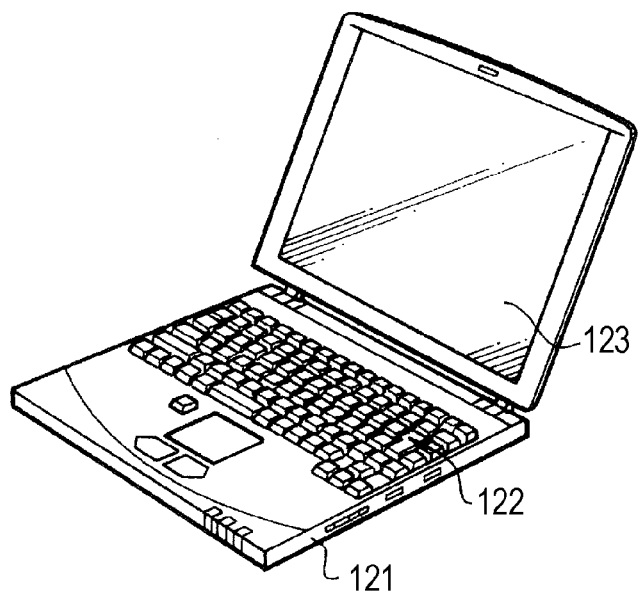
FIG. 13 is a perspective view showing a notebook personal computer to which the present invention is applied.

FIG. 13 is a perspective view showing a notebook personal computer to which the present invention is applied. The notebook personal computer according to this application example includes a body 121, a keyboard 122 operated when a text or the like is inputted, a display section 123 that displays an image, and the like, and is manufactured by using the display device according to the present invention as the display section 123.

Figure 14:
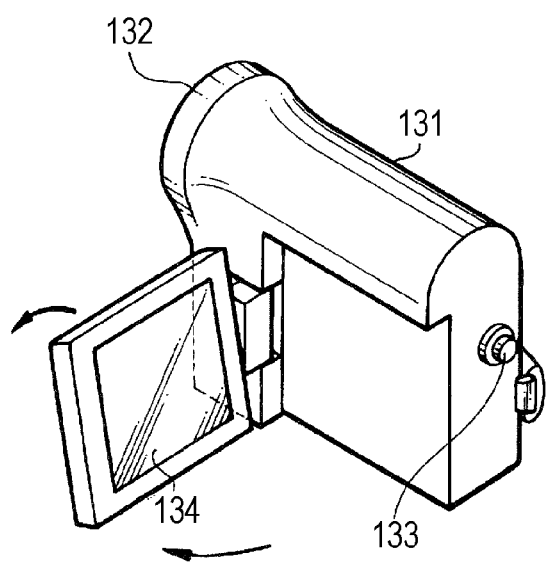
FIG. 14 is a perspective view showing a camcorder to which the present invention is applied.

FIG. 14 is a perspective view showing a camcorder to which the present invention is applied. The camcorder according to this application example includes a body 131, a subject-taking lens 132 on a side face that points to the front, a start/stop switch 133 used during video taking, a display section 134, and the like, and is manufactured by using the display device according to the present invention as the display section 134.

FIG. 15 is a diagram showing a portable terminal device such as a cellular phone to which the present invention is applied, in which (A) is a front view when the phone is open, (B) is a side view thereof, (C) is a front view when the phone is closed, (D) is a left side view, (E) is a right side view, (F) is a top view, and (G) is a bottom view. The cellular phone according to this application example includes an upper case 141, a lower case 142, a connecting section (herein, hinge section) 143, a display 144, a sub display 145, a picture light 146, a camera 147, and the like, and is manufactured by using the display device according to the present invention as the display 144 or the sub display 145.

According to the manufacturing method of the embodiment described above, only the surface side of the light absorption layer 19 is oxidized during the crystallization annealing treatment of the amorphous silicon film 15 as described using FIG. 1(4). As a result, uncontrollable generation of heat caused by explosive oxidation occurring when the entire light absorption layer 19 is oxidized in a depth direction is prevented and a thin film is crystallized by well-controlled generation of heat of the light absorption layer 19 without disposing an insulating film for inhibiting oxidation on the light absorption layer 19 and without applying energy lines Lh in an inert gas atmosphere. Consequently, crystallization can be performed at low costs due to simpler process and treatment in the air that does not require vacuum equipment.

In addition, oxidation reaction occurs at a certain temperature or higher, for example, at 500° C. or higher in the case of molybdenum as described above. Therefore, the temperature becomes a threshold value and temperature-controlled crystallization is performed with good reproducibility even if the power density of the application of energy lines Lh is set to be a value that is about two-orders of magnitude higher than that of the related art, which can provide efficient crystallization. Accordingly, crystallization can be efficiently performed with good controllability. Furthermore, oxidation occurs at, for example, about 500° C. and temperature control is thus achieved as described above. Therefore, since the interface between the substrate 1 and the amorphous silicon film 15 is held at a temperature of 500° C. or less, there is no damage to the substrate 1 and film detachment, stress, warpage of a substrate, and cracking of a substrate are not caused.

Consequently, the application of the crystallization method described above can simplify the manufacturing steps of the thin film transistor Tr and the display device 5 that uses the thin film transistor Tr and reduce the costs. In addition, a thin film transistor Tr whose characteristics are improved and characteristic variation between devices is low can be obtained by using the microcrystalline silicon film 15a that is crystallized with good controllability. Moreover, display characteristics can be improved by controlling the drive of a display device using such a thin film transistor Tr. Specifically, 1% or less could be achieved for brightness variation of adjacent portions 6 divided by average value.

Note that, since the thin film transistor Tr is constituted using the microcrystalline silicon film 15a in a channel region, the shift of a threshold value Vth can be reduced to a value achieved when a polycrystalline silicon film is used in a channel region.

This embodiment described above has exemplified manufacturing of a bottom-gate thin film transistor Tr and a thin film transistor substrate 3 in which the bottom-gate thin film transistor Tr is disposed, as a manufacturing method of a semiconductor device. However, a top-gate thin film transistor may be used. In this case, a source electrode and a drain electrode are formed above the substrate 1, and a source and a drain composed of n+ amorphous silicon are further formed. Subsequently, an amorphous silicon film and a light absorption layer are formed so as to cover the source and the drain, and crystallization annealing treatment may be performed by applying the energy lines described above from its upper side. After that, the light absorption layer is removed and a gate insulating film is formed. A gate electrode is formed thereon.

Furthermore, the present invention is not limited to the application to manufacturing of the thin film transistor Tr and the thin film transistor substrate 3 in which the thin film transistor Tr is disposed, and can be widely applied to manufacturing of an element and a device including the step of performing crystallization after a semiconductor thin film or a thin film composed of other materials is formed.

In addition, this embodiment has exemplified an organic EL display device as a display device that uses a thin film transistor substrate. However, the display device to which the present invention is applied is not limited to an organic EL display device, and can be applied to other flat panel displays such as a liquid crystal display device as long as, for example, the suppression of threshold variation, the improvement in mobility, or the in-plane characteristic uniformity of a thin film transistor is required as a driving element. Such a display device can produce the same effects.

The invention claimed is:

1. A method for crystallizing a thin film, the method comprising:
    a step of forming a thin film on a substrate;
    a step of forming a light absorption layer on the thin film; and
    a step of, while annealing only a surface side of the light absorption layer by irradiating the light absorption layer with energy lines, crystallizing the thin film using heat generated by thermal conversion of the energy lines at the light absorption layer and heat of the annealing reaction.

2. The method for crystallizing a thin film according to claim 1, wherein an amorphous semiconductor thin film is formed as the thin film.

3. The method for crystallizing a thin film according to claim 1, wherein the irradiation with the energy lines is performed in the air.

4. The method for crystallizing a thin film according to claim 1, wherein continuous-wave laser is used as the energy lines.

5. The method for crystallizing a thin film according to claim 1, wherein energy is controlled during the irradiation with the energy lines such that the thin film is microcrystallized.

6. The method for crystallizing a thin film according to claim 1, wherein the irradiation with the energy lines is performed with an irradiation position relative to the light absorption layer being moved.

7. The method for crystallizing a thin film according to claim 1, wherein the irradiation with the energy lines is partly conducted on a selected position of the light absorption layer.

8. A method for manufacturing a thin film semiconductor device, the method comprising:
    a step of forming a semiconductor thin film on a substrate;
    a step of forming a light absorption layer on the semiconductor thin film; and
    a step of, while annealing only a surface side of the light absorption layer by irradiating the light absorption layer with energy lines, crystallizing the semiconductor thin film using heat generated by thermal conversion of the energy lines at the light absorption layer and heat of the annealing reaction.

9. The method for manufacturing a thin film semiconductor device according to claim 8, further comprising:
    a step of forming a gate electrode on the substrate and coating the gate electrode with a gate insulating film before the step of forming the semiconductor thin film.

10. The method for manufacturing a thin film semiconductor device according to claim 8, characterized by further comprising:

a step of removing the light absorption layer and forming a gate electrode through a gate insulating film after the step of crystallizing the semiconductor thin film.

11. The method for manufacturing a thin film semiconductor device according to claim 9, wherein in the step of crystallizing the semiconductor thin film, generation of heat caused by absorption of the energy lines at the gate electrode is used in combination.

12. A method for manufacturing an electronic apparatus in which a thin film semiconductor device is disposed on a substrate, the method comprising, when the thin film semiconductor device is formed:

a step of forming a semiconductor thin film on the substrate;

a step of forming a light absorption layer on the semiconductor thin film; and a step of, while annealing only a surface side of the light absorption layer by irradiating the light absorption layer with energy lines, crystallizing the semiconductor thin film using heat generated by thermal conversion of the energy lines at the light absorption layer and heat of the annealing reaction.

13. A method for manufacturing a display device in which a thin film semiconductor device and a pixel electrode connected thereto are formed on a substrate, the method comprising, when the thin film semiconductor device is formed:

a step of forming a semiconductor thin film on the substrate;

a step of forming a light absorption layer on the semiconductor thin film; and a step of, while annealing only a surface side of the light absorption layer by irradiating the light absorption layer with energy lines, crystallizing the semiconductor thin film using heat generated by thermal conversion of the energy lines at the light absorption layer and heat of the annealing reaction.

* * * * *